United States Patent [19]
Wen

[11] Patent Number: 6,100,775
[45] Date of Patent: Aug. 8, 2000

[54] VERTICAL INTERCONNECT CIRCUIT FOR COPLANAR WAVEGUIDES

[75] Inventor: Cheng P. Wen, Mission Viejo, Calif.

[73] Assignee: Raytheon Company, Lexington, Mass.

[21] Appl. No.: 09/173,354

[22] Filed: Oct. 15, 1998

[51] Int. Cl.[7] .................................................. H01P 5/02
[52] U.S. Cl. ............................................................ 333/33
[58] Field of Search ................................... 333/247, 260, 333/33

[56] References Cited

U.S. PATENT DOCUMENTS

| | | | |
|---|---|---|---|
| 5,057,798 | 10/1991 | Moye et al. ............................. | 333/33 |
| 5,424,693 | 6/1995 | Lin ........................................... | 333/33 |
| 5,510,758 | 4/1996 | Fujita et al. ............................. | 333/247 |
| 5,552,752 | 9/1996 | Sturdivant et al. .................. | 333/260 X |

*Primary Examiner*—Justin P. Bettendorf
*Attorney, Agent, or Firm*—Leonard A. Alkov; William C. Schubert; Glenn H. Lenzen, Jr.

[57] ABSTRACT

A transition circuit is useful for coupling a first coplanar waveguide and a second coplanar waveguide disposed either on opposite sides of the same substrate or on different substrates. The first coplanar waveguide has a first signal conductor and a first pair of ground planes and the second coplanar waveguide has a second signal conductor and a second pair of ground planes. The transition circuit includes a signal interconnect coupling the first signal conductor to the second signal conductor and a pair of elongated interconnects coupling the first pair of ground planes to the second pair of ground planes. Each elongated interconnect is spaced from the signal interconnect.

16 Claims, 2 Drawing Sheets

VERTICAL INTERCONNECT CIRCUIT FOR COPLANAR WAVEGUIDES

BACKGROUND OF THE INVENTION

1. Field of the Invention

The invention relates generally to microwave devices and, more particularly, to vertical interconnections between coplanar waveguides.

2. Description of the Related Art

A conventional flip-chip microwave device includes a monolithic microwave integrated circuit (MMIC) flip-mounted on an assembly substrate. Either the MMIC and/or the assembly substrate typically has metal bumps to couple the MMIC to output circuits disposed on the assembly substrate. This flip-chip MMIC technology has provided numerous advances in microwave device fabrication, not the least of which involves utilizing the surface tension of the molten bump metal (i e., solder) to align accurately the MMIC and the output circuit of the assembly substrate.

Such microwave devices commonly include coplanar waveguides for low loss signal transmission in both the MMIC and the output circuit on the assembly substrate. At a vertical transition between the MMIC and the output circuit, bumps are provided for connecting the respective center conductors and ground planes of the two coplanar waveguides. Such vertical interconnections have utilized round or square bumps in a ground-signal-ground configuration dictated by the location of the center conductors and the ground planes. As a result, the signal-carrying bump has typically been disposed between the two ground bumps.

The advantages provided by the use of coplanar waveguides in both the MMIC and the output circuit are hampered by these vertical interconnections. Interest in operating such flip-chip devices at ever higher microwave frequencies has introduced radiation losses as the spacing between the bumps becomes a significant fraction of the wavelength of the transmitted signals. For example, once the distance between the inner edges of the ground bumps approaches one-half of the wavelength, such radiation losses arise from the vertical transition circuit behaving similar to a half-wavelength dipole radiating element. Radiation losses may arise from propagation through the MMIC substrate as well as through free space, in which case the relevant wavelength is appropriately adjusted by the dielectric constant of the substrate. In general, these radiation losses have limited the operating frequency of current microwave devices.

Other losses arise from vertical transition impedance mismatch. These vertical interconnections are typically inductive in nature, as it is difficult to dispose the ground bumps close enough to the signal-carrying bump to achieve significant capacitance therebetween. A series resistor-inductor lumped equivalent circuit results and, depending on the impedance of the coplanar waveguides, a potentially highly undesirable circuit discontinuity may exist at each vertical transition. The impedance mismatch between the coplanar waveguides and the vertical transition circuit becomes more pronounced as the operating frequency increases, inasmuch as the impedance of a series inductor increases linearly with frequency. Still further, impedance mismatch increases at an even greater rate as the wavelength of the operating frequency approaches the spacing between the bumps.

Micromachined membrane devices, which typically include one or more thin silicon substrates having circuitry disposed on both sides, have encountered similar complications in connection with the vertical interconnections passing through each substrate. These vertical interconnections (in this case, vias) are indispensable for connecting the circuits disposed on opposite sides of the same substrate. To the extent that such micromachine devices have included coplanar waveguides for transmitting microwave signals, the devices have utilized ground-signal-ground configurations for each via similar to the bump interconnections used in connection with flip-chip modules. Consequently, the same impedance mismatch and radiation loss problems thwart attempts to operate micromachined membrane devices at higher frequencies.

SUMMARY OF THE INVENTION

In accordance with one aspect of the present invention, a transition circuit is useful for coupling a first circuit element and a second circuit element. The first and second circuit elements comprise first and second signal conductors and first and second ground conductors, respectively. The transition circuit includes a signal interconnect coupling the first signal conductor to the second signal conductor and an elongated interconnect coupling the first ground conductor to the second ground conductor. The elongated interconnect is spaced from the signal interconnect.

In accordance with another aspect of the present invention, a microwave device has first and second substrates and first and second circuit elements disposed on the first and second substrates, respectively. The first and second circuit elements comprise first and second ground conductors, respectively. The microwave device further includes a signal interconnect coupling the first circuit element to the second circuit element and a pair of elongated interconnects coupling the first ground conductor to the second ground conductor. Each elongated interconnect is spaced from the signal interconnect to shield the signal interconnect.

In accordance with yet another aspect of the present invention, a microwave circuit comprises first and second coplanar waveguides having first and second center conductors, respectively, and first and second pairs of ground conductors spaced from the first and second center conductors, respectively. The microwave circuit further comprises a signal interconnect coupling the first center conductor to the second center conductor and a pair of elongated interconnects coupling a respective ground conductor of the first pair of ground conductors to a corresponding ground conductor of the second pair of ground conductors. Each elongated interconnect is spaced from the signal interconnect to shield the signal interconnect.

DETAILED DESCRIPTION OF THE INVENTION

The present invention relates to a vertical interconnection configuration that provides a vertical transition circuit exhibiting low radiation losses and the capability for matching the impedances of the circuits being interconnected. A combination of one or more elongated interconnects (e.g., bumps or vias) and shunt capacitors is useful for achieving a low loss vertical interconnection between two coplanar waveguides. The two coplanar waveguides may be disposed, for example, on opposite sides of a single substrate (as in a micromachined membrane module), or on two separate substrates connected to form a flip-chip microwave module.

In general, vertical transition circuits according to the present invention include two elongated electrodes (i.e., conductors) connected to the respective ground planes of the two coplanar waveguides. These elongated, grounded conductors sandwich a signal-carrying conductor connecting the respective center conductors of the two coplanar waveguides. The two elongated, grounded conductors shield the signal-carrying conductor to reduce radiation loss. This elongated conductor configuration also provides additional capacitance for impedance matching. Shunt capacitances may be added to fine tune the impedance of the vertical transition circuit to match the impedance of the coplanar waveguides being connected.

Figure 1:
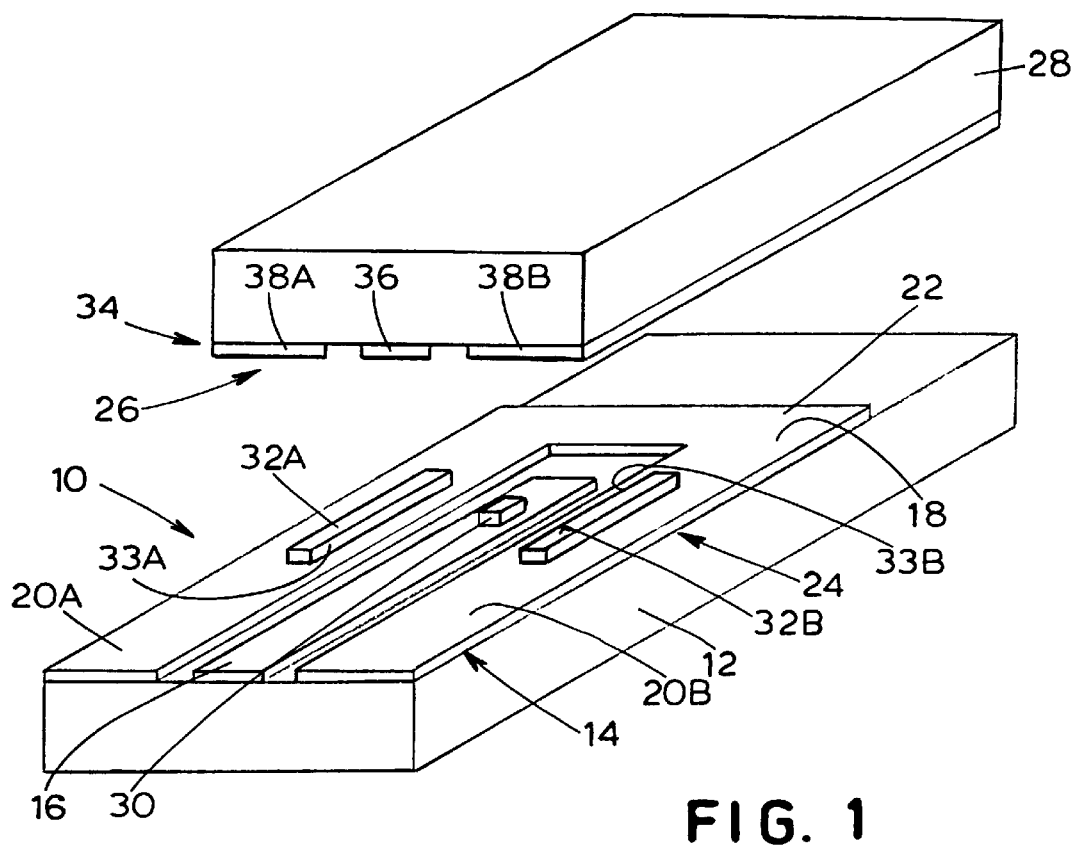
FIG. 1 is an exploded, perspective view of a simplified flip-chip microwave module having a vertical transition circuit in accordance with one embodiment of the present invention.

With reference to FIG. 1, a monolithic microwave integrated circuit (MMIC) element 10 is disposed on a substrate 12. The MMIC element 10 is simplified for purposes of illustration to include essentially a coplanar waveguide 14 having a center conductor 16 and a ground conductor 18. The ground conductor 18, in turn, includes a pair of ground planes 20A and 20B disposed on either side of the center conductor 16. As will be understood by those skilled in the art, the coplanar waveguide configuration provides for low loss transmission of microwave frequency signals on the center conductor 16 (i.e., between the center conductor 16 and the reference potential established by the ground planes 20A–20B).

The ground conductor 18 may include one or more portions 22 coupling the ground planes 20A–20B to maintain a consistent reference potential. As used herein, a ground conductor may refer to a collective ground electrode comprising the ground planes 20A–20B, the portion 22, and/or any other electrode or conductor disposed at a reference potential for the MMIC 10. In other words, the ground conductor 18 may encompass each of the electrodes or conductors in the MMIC 10 that are coupled directly or indirectly to provide the reference potential. It will also be noted that the ground planes 20A–20B need not comprise actual planes in the sense that they are at the same level (i.e., flat) or be limited to a particular size or shape. The term "ground plane" will be understood to refer to any grounded electrode associated with a coplanar waveguide that is accordingly spaced from the signal-carrying, center conductor of the coplanar waveguide.

With continued reference to FIG. 1, a vertical transition circuit 24 is provided to transmit the signal carried by the coplanar waveguide 14 from the MMIC element 10 to an output circuit element 26 disposed on an assembly substrate 28. The output circuit element 26 may, of course, comprise only a portion of a larger output circuit and, accordingly, has also been simplified for purposes of illustration only. The vertical transition circuit 24 includes a plurality of vertical interconnects, each of which comprises a metal bump protruding from the MMIC element 10. The metal bumps may be fabricated in a variety of well-known methods (e.g., deposition) using highly conductive materials conventional for MMICs, such as gold, silver, copper, and the like. Each bump may be deposited on an existing metal layer (e.g., one of the conductors of the coplanar waveguide) or, alternatively, be formed integrally therewith. Bumps disposed on a certain conductor or electrode will be understood to include either of these configurations and any other configuration resulting from a well-known method of fabricating vertical interconnects. Accordingly, bumps or interconnects referred to separately from any conductor or electrode to which they are coupled may, in fact, be formed integrally therewith, or distinctly therefrom.

In accordance with one embodiment of the present invention, the plurality of interconnects or bumps includes a signal bump 30 disposed on the center conductor 16, and a pair of elongated ground bumps 32A and 32B disposed on the pair of ground planes 20A–20B, respectively. While FIG. 1, of course, has not been presented to depict these elements to scale, the elongated ground bumps 32A–32B should be of a size and shape sufficient to shield the signal bump 30. By shielding, it is meant that the elongated ground bumps 32A–32B surround the signal bump 30 sufficiently to minimize electromagnetic radiation from the signal bump 30. In other words, in general, an increase in the extent to which the ground bumps 32A–32B are elongated, in turn, increases the waveguide-like behavior of the vertical interconnection. For example, signal loss via radiation propagation is cut off as long as the distance between inner walls 33A and 33B of the elongated ground bumps 32A–32B is less than one-half of the wavelength associated with the operating frequency of the microwave device of which the MMIC element 10 is a part.

The elongated nature of the ground bumps 32A–32B also potentially introduces a shunt capacitance to the vertical is transition circuit 24 for impedance matching with the coplanar waveguide 14 and preferably also the output circuit element 26. To that end, and as shown in FIG. 1, the ground bumps 32A–32B are elongated in a manner parallel to the coplanar waveguide 14 and/or the output circuit element 26 (or at least one of the substrates 12 and 26). That is, the ground bumps 32A–32B are elongated in a manner not parallel to the vertical direction in which the signal bump 30 couples the center conductor 16 to the output circuit element 26 to shield the signal bump and decrease impedance mismatch. In one embodiment, to achieve such capacitive effects and minimize radiation losses, the ground bumps 32A–32B may be elongated to the point where most of the electric field lines emanating from the signal bump 30 terminate at the inner walls of the ground bumps 32A–32B.

FIG. 1 is an exploded view of a portion of a flip-chip MMIC module in that the MMIC element 10 and the substrate 1 2 will be flipped and mounted on the output circuit 26 and the assembly substrate 28. As is known to those skilled in the art, the plurality of interconnects forming the vertical transition circuit 24 will assist in this fabrication step, providing both self-alignment and adhesion. To this end, the output circuit element 26 may include a matching plurality of interconnects (i.e., bumps). In general, however, the output circuit element 26 comprises a collection of electrodes that match up with the plurality of interconnects of the vertical transition circuit 24. More particularly, the output circuit element 26 may comprise a coplanar waveguide 34 having a center conductor 36 and a pair of ground planes 38A and 38B. As a result of the similarity of the MMIC element 10 and the output circuit 26, it shall be noted that, in the simplified example of FIG. 1, the MMIC element 10 and the output circuit element 26 are interchangeable. Hence, the present invention is not limited to disposing the vertical transition circuit 24 initially on the MMIC element 10 (or, for that matter, the output circuit element 26).

Figure 2:
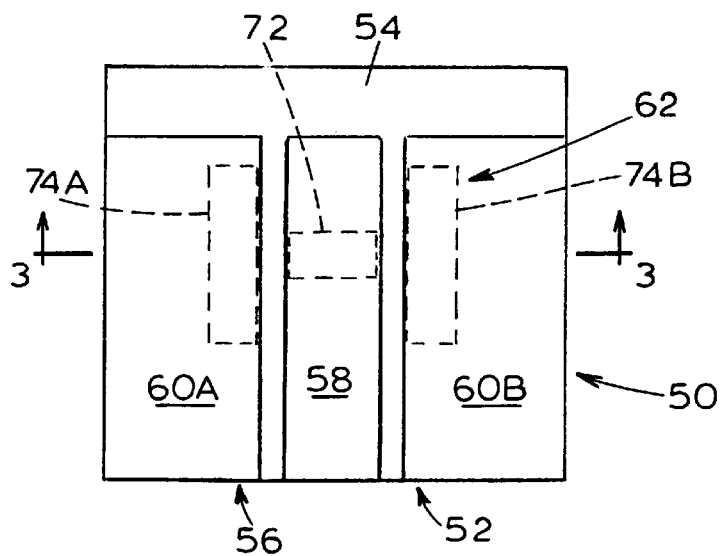
FIG. 2 is a plan view of a simplified micromachined membrane module having a vertical transition circuit (shown in phantom) in accordance with another embodiment of the present invention.
Figure 3:
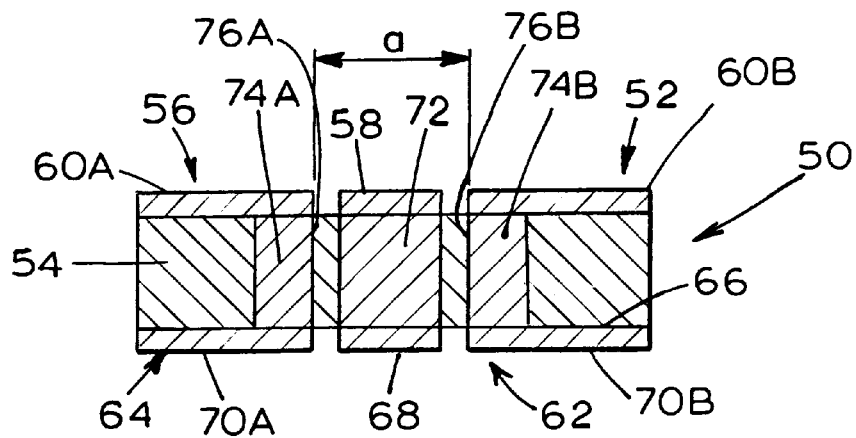
FIG. 3 is a cross-sectional view of the micromachined membrane module taken along the line 3—3 of FIG. 2.

Referring now to FIGS. 2 and 3, an alternative embodiment of the present invention is useful in connection with a micromachined membrane device 50, which has been simplified for purposes of illustration to include a single circuit element 52 disposed on a substrate (or membrane) 54. Actual micromachined membrane devices would, of course, more generally include multiple circuit elements distributed over a plurality of substrates or membranes. The circuit element 52 comprises a coplanar waveguide 56 having a center conductor 58 and a pair of ground planes 60A and 60B. As set forth hereinabove, the coplanar waveguide 56 is not limited to the particular size and shapes shown.

Shown in phantom in FIG. 2 and in cross-section in FIG. 3 is a vertical transition circuit 62 that comprises a plurality of interconnects, each of which includes a via extending through the substrate 54 to couple the circuit element 52 to a circuit element 64 (FIG. 3) disposed on an opposite side 66 (FIG. 3) of the substrate 52. Once again, for simplicity in illustration only, the circuit element 64 is shown to include only a coplanar waveguide having a center conductor 68 (FIG. 3) and a pair of ground planes 70A and 70B (FIG. 3).

In accordance with the present invention, the plurality of interconnects comprises a signal via 72 coupling the respective center conductors 58 and 68 and further comprises a pair of elongated, ground vias 74A and 74B coupling the corresponding ground planes of the respective pairs of ground planes 60A–60B and 70A–70B. As in the earlier embodiment involving bump interconnects, the plurality of via interconnects may be formed integrally with the conductors of the coplanar waveguide or, alternatively, be fabricated separately therefrom.

As best shown in FIG. 3, the distance between inner walls 76A and 76B of the elongated, ground vias 74A and 74B, respectively, which has been denoted "a," is determinative of whether signal losses will occur through radiation. Preferably, the distance "a" is less than one-half of the wavelength associated with the operating frequency of the microwave device. To this end, the elongated, ground vias 74A–74B may be positioned as shown, namely, as close together as permitted by the locations of the ground planes 60A–60B and 70A–70B. The ground vias 74A–74B need not, however, be disposed at the edges of the ground planes 60A–60B as shown, inasmuch as the shunt capacitance provided by further removed ground vias may be sufficient for matching the impedance of the vertical transition circuit to the impedances of the coplanar waveguides 56 and 62.

In general, the equivalent impedance of the vertical transition circuit is as follows:

$$Z_{eq}=(L/C)^{0.5}$$

where L is the lumped element equivalent inductance (per unit length) of the signal-carrying bump or via, and C is twice the shunt capacitance (per unit length) provided by the vertical transition circuit.

Figure 4:
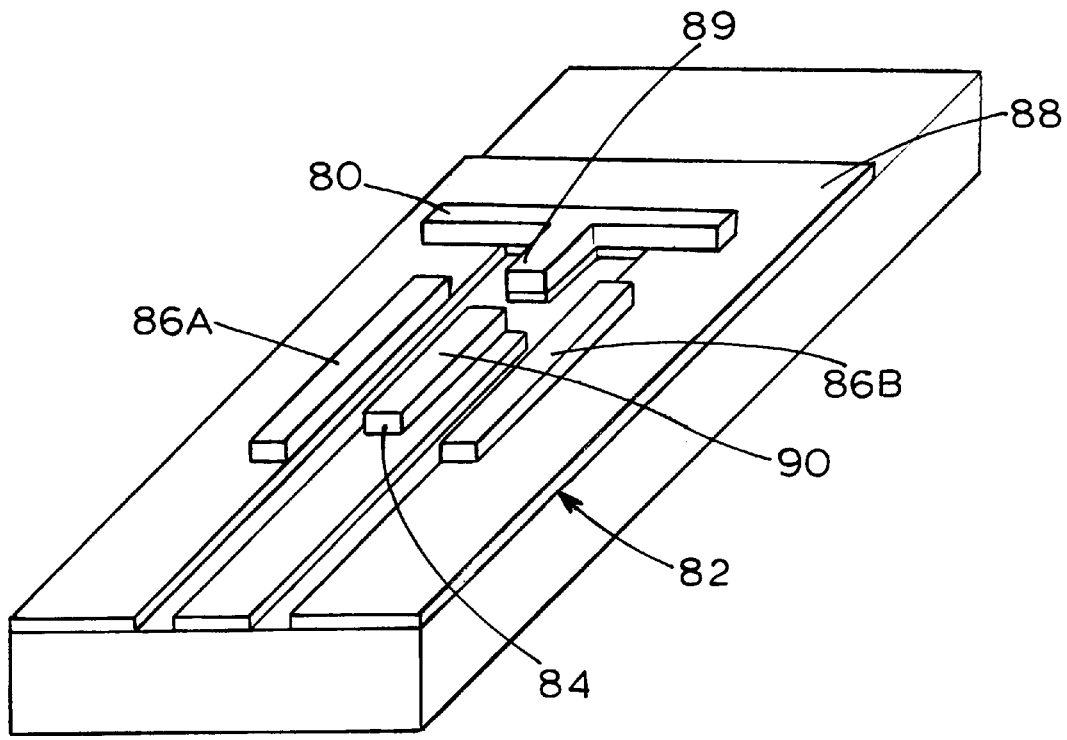
FIG. 4 is a partial, perspective view of a simplified flip-chip microwave module having a vertical transition circuit in accordance with yet another embodiment of the present invention.

Given current fabrication limitations, the capacitance provided by the elongated, ground vias 74A and 74B may not be sufficient, in which case additional shunt capacitance may be introduced by adding electrodes or conductors in close proximity to the signal via 72 or, in the embodiment of FIG. 1, the signal bump 30. As shown in FIG. 4, an additional electrode or conductor 80 may be disposed near an end of a coplanar waveguide 82 having a plurality of bump interconnects forming the basis for a transition circuit to an assembly substrate (not shown). The transition circuit comprises a signal bump 84 and a pair of elongated, ground bumps 86A and 86B. The coplanar waveguide 82 has a typical ground-signal-ground configuration, as does the plurality of bump interconnects. The same configurations, of course, apply equally well to a membrane circuit employing via-type interconnects rather than bump-type interconnects.

The additional electrode 80 is disposed on a ground section 88 similar to the ground portion 22 (FIG. 1), inasmuch as both the section 88 and the portion 22 are coupled to the ground planes of the coplanar waveguide being vertically interconnected. Because a portion 89 of the electrode 80 is disposed near an end 90 of the signal bump 84, the electrode 80 provides additional shunt capacitance in the transition circuit. The additional electrode 80 may comprise either an additional bump (or via as the case may be) such that a connection is made to a ground conductor on both substrates. However, fabrication limitations similar to those associated with disposing the ground bumps 86A–86B in close proximity to each other may place a process limit on the proximity of the portion 89 and the end 90, thereby potentially inhibiting efforts to introduce sufficient additional capacitance in the interest of matching impedances. Alternatively, the additional electrode 80 may not comprise a bump, but rather a grounded conductor with a height sufficient to provide significant capacitive effects but not so much as to inhibit the proximity of the electrode 80 and the signal bump 84. In this regard, the additional electrode 80 may comprise a grounded electrode or conductor disposed on either substrate (or substrate side) in close proximity to the signal bump or via.

The particular size and shape of the additional conductor 80 is not critical to the practice of the present invention. The size and shape of the conductor 80 may, however, be determined indirectly by processing limitations or limitations imposed by the need to achieve a suitable amount of shunt capacitance.

As shown in FIG. 4, in an alternative embodiment of the present invention, the signal bump 84 (or via) is elongated to provide yet more capacitance for the transition circuit. In this event, the plurality of interconnects acts like a tri-plate transmission line. As will be appreciated by those skilled in the art, elongating the signal bump may necessitate the lengthening of the ground bumps in the interest of maintaining the low radiation losses provided by the present invention. Such lengthening of the signal bump 84 may also necessitate relative elongation of the ground bumps for impedance matching purposes. As set forth hereinabove, lengthening the signal bump 84 increases the capacitance and decreases the inductance of the vertical interconnection. Lastly, the length of the signal bump 84 should stay small relative to a quarter-wavelength, so as to not introduce losses resulting from electric field variations.

Numerous other modifications and alternative embodiments of the invention will be apparent to those skilled in the art in view of the foregoing description. Accordingly, this description is to be construed as illustrative only. The details of the structure and method may be varied substantially without departing from the spirit of the invention, and the exclusive use of all modifications which are within the scope of the appending claims is reserved.

What is claimed is:

1. A transition circuit for coupling a first circuit element and a second circuit element wherein the first circuit element comprises a first signal conductor and a first ground conductor and the second circuit element comprises a second signal conductor and a second ground conductor, comprising:

a signal interconnect coupling the first signal conductor to the second signal conductor and having a direction in which the first and second signal conductor are coupled; and an elongated interconnect coupling the first ground conductor to the second ground conductor;

wherein the elongated interconnect is spaced from the signal interconnect and elongated in a manner not parallel to the direction of the signal interconnect to decrease impedance mismatch, and wherein the first circuit element and the second circuit element are disposed on opposite sides of a substrate.

2. The transition circuit of claim 1, further comprising a further elongated interconnect coupling the first ground conductor to the second ground conductor wherein:

the further elongated interconnect is spaced from the signal interconnect; and the first-named elongated interconnect and the further elongated interconnect have a length sufficient to shield the signal interconnect.

3. The transition circuit of claim 2, wherein:

the first and second circuit elements comprise first and second coplanar waveguides, respectively;

the first and second signal conductors comprise respective center conductors of the first and second coplanar waveguides;

the first ground conductor comprises a first pair of ground planes spaced from the center conductor of the first coplanar waveguide;

the second ground conductor comprises a second pair of ground planes spaced from the center conductor of the second coplanar waveguide; and the first-named elongated interconnect and the further elongated interconnect couple respective ground planes of the first pair of ground planes to corresponding ground planes of the second pair of ground planes.

4. The transition circuit of claim 3, wherein:

the signal interconnect carries a signal having a microwave frequency; and the first-named and further elongated interconnects are separated by a distance less than half of a wavelength associated with the microwave frequency.

5. The transition circuit of claim 3, wherein the signal interconnect is spaced from the first-named elongated interconnect and the further elongated interconnect such that an impedance a mismatch between the signal interconnect and at least one of the first and second circuit elements is minimized.

6. The transition circuit of claim 3, further comprising a conductor coupled to at least one of the first and second ground conductors and spaced from the signal interconnect a distance to add a shunt capacitance to the transition circuit.

7. The transition circuit of claim 1, wherein the signal interconnect is elongated.

8. A transition circuit for coupling a first circuit element and a second circuit element wherein the first circuit element comprises a first signal conductor and a first ground conductor and the second circuit element comprises a second signal conductor and a second ground conductor comprising:

a signal interconnect coupling the first signal conductor to the second signal conductor and having a direction in which the fist and second signal conductors are coupled; and an elongated interconnect coupling the first ground conductor to the second ground conductor;

wherein the elongated interconnect is spaced from the signal interconnect and elongated in a manner not parallel to the direction of the signal interconnect to decrease impedance mismatch, and wherein the first circuit element and the second circuit element are disposed on a first substrate and a second substrate, respectively, and the first and second substrates are coupled in flip-chip fashion.

9. The transition circuit of claim 8, further comprising:

a further elongated interconnect coupling the first ground conductor to the second ground conductor wherein:

the further elongated interconnect is spaced from the signal interconnect; and the first-named elongated interconnect and the further elongated interconnect have a length sufficient to shield the signal interconnect.

10. The transition circuit of claim 9, wherein:

the first and second circuit elements comprise first and second coplanar waveguides, respectively;

the first and second signal conductors comprise respective center conductors of the first and second coplanar waveguides;

the first ground conductor comprises a first pair of ground planes spaced from the center conduct of the first coplanar waveguide;

the second ground conductor comprises a second pair of ground planes spaced from the center conductor of the second coplanar waveguide; and the first-named elongated interconnect and the further elongated interconnect couple respective ground planes of the first pair of ground planes to corresponding ground planes of the second pair of ground planes.

11. The transition circuit of claim 10, wherein:

the signal interconnect carries a signal having a microwave frequency; and the first-named and further elongated interconnects are separated by a distance less than half of a wavelength associated with the microwave frequency.

12. The transmission circuit of claim 10, wherein the signal interconnect is spaced from the first-named elongated interconnect and the further elongated interconnect such that an impedance mismatch between the signal interconnect and at least one of the first and second circuit elements is minimized.

13. The transition circuit of claim 10, further comprising a conductor coupled to a least one of the first and second ground conductors and spaced from the signal interconnect a distance to add a shunt capacitance to the transition circuit.

14. The transition circuit of claim 8, wherein the signal interconnect is elongated.

15. A microwave circuit, comprising:

a first coplanar waveguide having a first center conductor and a first pair of ground conductors spaced form the first center conductor;

a second coplanar waveguide having a second center conductor and a second pair of ground conductors spaced from the second center conductor;

a signal interconnect coupling the first center conductor to the second center conductor; and a pair of elongated interconnects wherein each elongated interconnect couples a respective ground conductor of the first pair of ground conductors to a corresponding ground conductor of the second pair of ground conductors;

wherein each elongated interconnect is spaced form the signal interconnect and elongated in a manner parallel to at least one of the first and second coplanar waveguides to shield the signal interconnect and decrease impedance mismatch, and wherein the first and second coplanar waveguides are disposed on opposite sides of a substrate and the signal interconnect and the pair of elongated interconnects comprise via interconnects through the substrate.

16. The microwave circuit of claim 15, further comprising a shunt capacitance spaced from the signal interconnect and coupled to at least one of the ground conductors of the first and second pairs of ground conductors.

* * * * *